Figure 1:
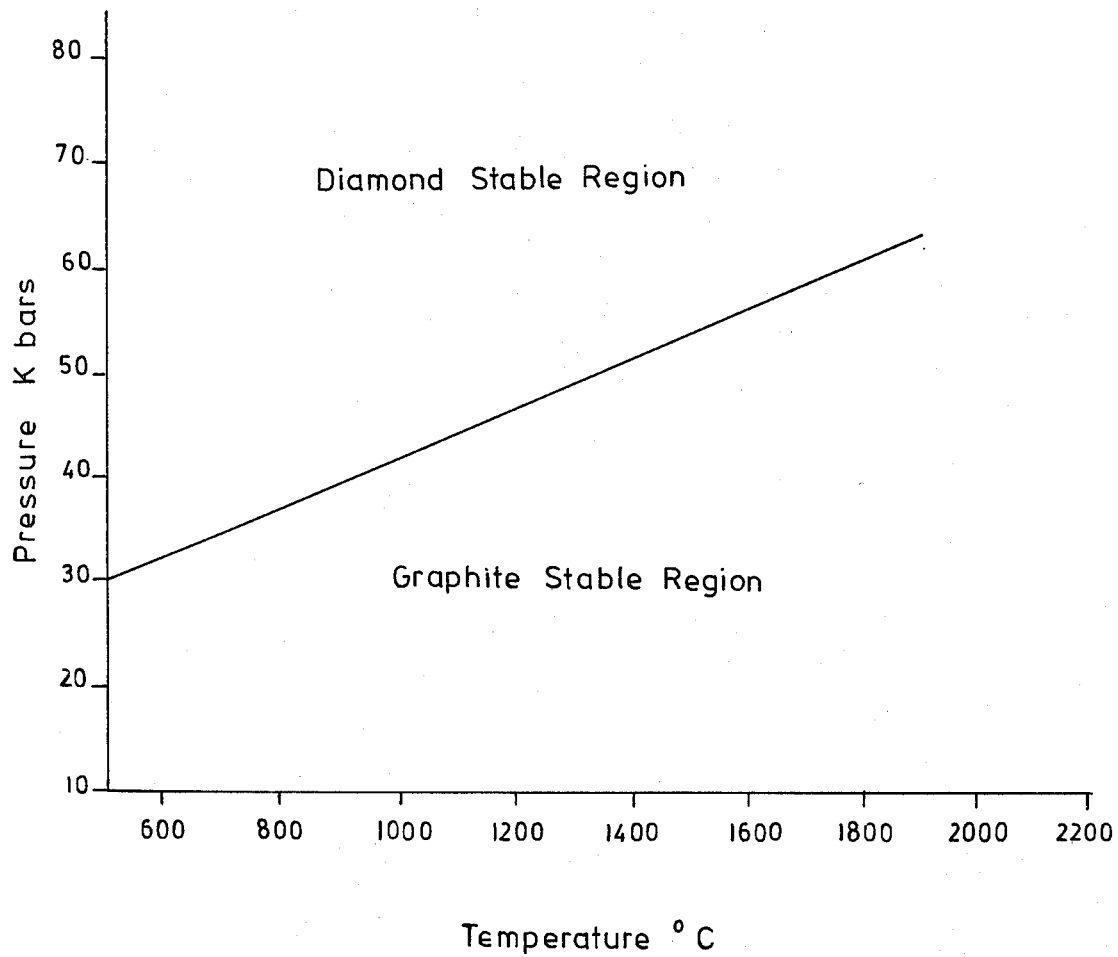

United States Patent [19]

Evans et al.

[11] 4,399,364

[45] Aug. 16, 1983

[54] DIAMOND TREATMENT

[76] Inventors: Trevor Evans, 8 Oaklands, Bulmershe Rd., Reading; Brian P. Allen, 52 Leicester Rd., Sapcote, Leicestershire, England

[21] Appl. No.: 302,398

[22] Filed: Sep. 15, 1981

Related U.S. Application Data

[63] Continuation of Ser. No. 109,407, Jan. 3, 1980, abandoned.

[30] Foreign Application Priority Data

Jan. 17, 1979 [GB] United Kingdom ................ 7901728

[51] Int. Cl.³ ................................................ B01J 3/06
[52] U.S. Cl. .............................. 250/492.1; 250/492.3; 423/446
[58] Field of Search .............. 250/492.1, 492.3, 492.2; 423/446; 204/157.1 H

[56] References Cited

U.S. PATENT DOCUMENTS

| 2,945,793 | 7/1960 | Dugdale | 250/492.1 |
| 2,998,365 | 8/1961 | Custers et al. | 250/492.1 |
| 4,124,690 | 11/1978 | Strong et al. | 423/446 |
| 4,184,079 | 1/1980 | Hudson et al. | 250/310 |

FOREIGN PATENT DOCUMENTS 660719 of 0000 United Kingdom .

OTHER PUBLICATIONS

Kittel, Introduction to Solid State Physics, Wiley Interscience, p. 37, (1957).

*Primary Examiner*—Alfred E. Smith
*Assistant Examiner*—Carolyn E. Fields

[57] ABSTRACT

A method of reducing the color of diamond of type 1b including the steps of exposing the diamond to irradiation capable of causing atomic displacements in the diamond, for example the irradiation may be electron bombardment of energy greater than 300 KeV, followed by heat treating the irradiated diamond at a temperature in the range 1600° C. to 2200° C. under a pressure at which the diamond is crystallographically stable at the temperature used.

9 Claims, 1 Drawing Figure

DIAMOND TREATMENT

This is a continuation of application Ser. No. 109,407 filed Jan. 3, 1980, now abandoned.

This invention relates to diamond treatment and more particularly to a method of reducing the colour of diamond of type 1b.

Diamond of type 1b contains dispersed nitrogen and this imparts to the diamond a colour ranging from yellow to green. Most synthetic diamonds are of the type 1b. Diamond of type 1a, on the otherhand, contains nitrogen in an aggregated form. Such diamonds are colourless or yellow.

According to the present invention, a method of reducing the colour of diamond of type 1b includes the step of exposing the diamond to irradiation capable of causing atomic displacements in the diamond followed by heat treatment at a temperature in the range 1600° C. to 2200° C. under a pressure at which diamond is crystallographically stable at the temperature used.

The pressure at which the heat treatment takes place is that at which diamond is crystallographically stable at the particular temperature used. The use of this pressure prevents, or prevents any significant, graphitisation of the diamond. The pressures which can be employed for any particular temperature of heat treatment are easily ascertainable from the carbon phase diagram which is illustrated graphically by FIG. 1.

The apparatus which is used to effect heat treatment under pressure can be any high temperature/pressure apparatus well known in the art.

The irradiation may be electron bombardment of energy greater than 300 KeV. Preferably, the energy of the electron bombardment is greater than 1 MeV, typically 2 MeV.

The irradiation may also be with other particles of sufficient energy to produce atomic displacements in diamond such as neutron bombardment or gamma irradiation.

The flux of the irradiation is preferably such as to produce at least $10^{+18}$ vacancies per cubic centimeter in the diamond.

The period of heat treatment will vary according to the degree of reduction in colour desired. Generally, however, the period of heat treatment will not normally exceed two hours. The preferred temperature of heat treatment is in the range 1900° C. to 2200° C.

The invention has particular application to synthetic diamonds, particularly large ones of gem stone quality.

It has surprisingly been found that the treatment of synthetic diamonds of Type 1b according to the invention produces platelets in the diamond which are similar to platelets in natural diamonds. These platelets are in the {100} planes with a diameter of 100 A and at a concentration of about $10^{14}$ per cc. The platelets show the same features under diffraction in the electron microscope as platelets of natural diamonds.

The results of certain experiments are given hereinbelow. The table shows that the method results in a reduction in the heat treatment time used for color reduction of the diamonds.

EXPERIMENTAL RESULTS

| SPECIMEN | TREATMENT (Total Time) | RESULTS - U. V. ABSORPTION |
|---|---|---|
| HN1 | | absorption edge initially at 22000 cm$^{-1}$ |
| | ¾ hour at 1950° C. | absorption edge at 23600 cm$^{-1}$ |
| | 2 hours 10 minutes at 1950° C. | absorption edge at 25200 cm$^{-1}$ and $\mu 25000 = 100$ cm$^{-1}$ |
| | 4 hours 25 minutes at 1950° C. | $\mu 25000 = 70$ cm$^{-1}$ |
| | 5 hours 35 minutes at 1950° C. | $\mu 25000 = 45$ cm$^{-1}$ |
| | +15 minutes at 2150° C. | $\mu 25000 = 24$ cm$^{-1}$ |
| HN4 | | absorption edge initially at $\sim 2200$ cm$^{-1}$ |
| | 1 hour 50 minutes at 2050° C. | absorption edge at $\sim 24200$ cm$^{-1}$ |
| HN10 | | absorption edge initially at 22000 cm$^{-1}$ |
| | 27 hours electron irradiation at 2MeV followed by 20 minutes at about $\sim 2050°$ C. | absorption edge at 34,000 cm$^{-1}$ and $\mu 25000 = 26$ cm$^{-1}$ |
| HN6 | | absorption edge at 22,000 cm$^{-1}$ |
| | 33½ hours electron irradiation at 2MeV followed by 30 minutes at 2000° C. | absorption edge at 34,000 cm$^{-1}$ and $\mu 25000 = 39$ cm$^{-1}$ |

In all the above experiments, the pressure used for the heat treatment was 80 Kbars and the apparatus was conventional high temperature/pressure apparatus.

The significant reduction in colour of the diamonds for experiments HN 10 and HN 6 (using the method of the invention) will be noted, as seen from the change in the absorption edge. In all experiments the starting diamond was synthetic diamond of type 1b.

The absorption edge moves to high frequencies during heat treatment due to the reduction in the number of single substitutional nitrogen atoms in the diamond lattice. This reduction is caused by the aggregation of single nitrogen atoms.

We claim:

1. A method for reducing the color of type 1B diamonds containing dispersed nitrogen, which dispersed nitrogen imparts to said diamonds a color ranging from yellow to green, the method includes the step of heat treating said diamonds at a temperature in the range of 1,600° C. to 2,200° C. under a pressure at which said diamonds are crystallographically stable at the particular temperature employed, said heat treatment being continued so as to effect aggregation of the dispersed nitrogen and thereby reduce the color of said diamonds, the improvement comprising in combination with said heating step the additional step of:

reducing the time required for said heat treatment step to achieve said color reduction by employing an exposing step prior to said heat treatment step, said exposing step comprising exposing the diamond to irradiation of sufficient strength to cause atomic displacements in said diamond and continuing said irradiation until atomic displacement occurs, the flux of said irradiation being such as to produce at least $10^{+18}$ vacancies per cubic centimeter in said diamond.

2. A method of claim 1 wherein the irradiation is electron bombardment of energy greater than 300 KeV.

3. A method of claim 2 wherein the energy of the electron bombardment is greater than 1 MeV.

4. A method of claim 2 wherein the energy of the electron bombardment is 2 MeV.

5. A method of claim 2 wherein the temperture of heat treatment is in the range 1900° C. to 2200° C.

6. A method of claim 1 wherein the irradiation is neutron bombardment or gamma irradiation.

7. A method of claim 1 wherein the temperature of heat treatment is in the range 1900° C. to 2200° C.

8. A method of claim 1 wherein the diamond is synthetic diamond.

9. A method according to claim 1 wherein the duration of said heat treatment is about 30 minutes.

* * * * *